United States Patent [19]
Fujisaki

[11] Patent Number: 5,153,531
[45] Date of Patent: Oct. 6, 1992

[54] ARRANGEMENT FOR STABILIZING OSCILLATION FREQUENCY AND PHASE OF A HIGH FREQUENCY OSCILLATOR

[75] Inventor: Hirotaka Fujisaki, Neyagawa, Japan

[73] Assignee: Matsushita Electric Industrial Co., Ltd., Osaka, Japan

[21] Appl. No.: 785,105

[22] Filed: Oct. 30, 1991

[30] Foreign Application Priority Data

Oct. 31, 1990 [JP] Japan ............... 2-295758

[51] Int. Cl.⁵ .................. H03B 1/04; H03B 5/00; H03B 7/00; H05K 5/04
[52] U.S. Cl. .................. 331/67; 331/68; 361/399
[58] Field of Search ............ 331/67, 68, 96, 107 DP, 331/117 D, 187; 361/399, 415

[56] References Cited

U.S. PATENT DOCUMENTS

| | | | |
|---|---|---|---|
| 4,491,806 | 1/1985 | Reynolds et al. | 331/96 |
| 4,677,396 | 6/1987 | Cruz et al. | 331/117 R |
| 4,873,495 | 10/1989 | Doyen et al. | 331/68 |
| 4,903,169 | 2/1990 | Kitagawa et al. | 361/424 |

Primary Examiner—David Mis
Attorney, Agent, or Firm—Wenderoth, Lind & Ponack

[57] ABSTRACT

An arrangement for stabilizing the oscillation frequency and phase of a high frequency oscillator comprising a shielding case of aluminum formed by die casting and having side walls and a base, a plurality of partition walls integrally formed with the shielding case, a printed circuit board securely mounted on the partition walls, and a high frequency oscillator securely mounted on the printed circuit board. The high frequency osilllator is encompassed with and shielded by the side walls and base of the shielding case, the partition walls, and the printed circuit board.

4 Claims, 3 Drawing Sheets

ARRANGEMENT FOR STABILIZING OSCILLATION FREQUENCY AND PHASE OF A HIGH FREQUENCY OSCILLATOR

BACKGROUND OF THE INVENTION

1. Field of the Invention

The present invention relates generally to a high frequency oscillator, and more particularly to an arrangement for stabilizing the oscillation frequency and phase of a high frequency oscillator for use in a microwave data communication device or the like.

2. Description of the Prior Art

A high frequency oscillator for use in a microwave data communication device requires a highly stable oscillation frequency and phase against microphonic vibrations, which would exert bad influence thereon.

FIGS. 1 and 2 depict a conventional arrangement for stabilization of the oscillation frequency and phase of a high frequency oscillator accommodated in a shielding case 1 of aluminum formed by die casting.

The high frequency oscillator comprises a printed circuit board 4 secured to the shielding case 1 by means of a plurality of screws 2 and an oscillator component 7 mounted on an area 3 formed on the printed circuit board 4. The oscillation frequency is determined by a circuit constant of the oscillator and a space defined by the shielding case 1 and a cover 8.

FIGS. 3 and 4 depict another conventional arrangement for stabilization of the oscillation frequency and phase of a high frequency oscillator.

The high frequency oscillator of FIGS. 3 and 4 is a packaged oscillator 9 in which an oscillation circuit is mounted in a shielded package and which is mounted on a printed circuit board 4 secured to a shielding case 1 by means of a plurality of screws 2. In this oscillator, the oscillation frequency depends on the packaged oscillator itself.

In an oscillator utilized in a microwave data communication device or the like, because a modulated carrier is further digitally modulated, the frequency and phase of the oscillator must be highly stable against microphonic vibrations. To satisfy this characteristic, the oscillator of FIG. 1 employs a cover 8 of aluminum formed by die casting. which makes substantially unchanged space conditions determined by the shielding case 1 and the cover 8 against the microphonic vibrations. In the oscillator of FIG. 3, the use of the packaged oscillator 9 makes space conditions in the package substantially unchanged even if those determined by the shielding case 1 and the cover 8 change. Accordingly, the frequency and phase of the oscillator are stable against microphonic vibrations.

In the case of FIG. 1, however, because the cover 8 is required to have the same size as that of the shielding case 1, vibrations occasionally cause distortion particularly in the proximity of the center of the cover 8. Accordingly, the cover 8 must be made thick and strong, for example, by aluminum die casting, and therefore, the oscillator becomes expensive and cannot be made compact.

In the case of FIG. 3, the packaged oscillator 9 itself is very expensive. Furthermore, because the oscillator 9 requires a wide area on which it is mounted, it cannot be made compact.

SUMMARY OF THE INVENTION

The present invention has been developed to overcome the above-described disadvantages.

It is accordingly an object of the present invention to provide an improved arrangement for a high frequency oscillator, which is capable of making space conditions highly stable, on which the frequency and phase of the oscillator depends, against microphonic vibrations.

In accomplishing this and other objects, an arrangement according to the present invention comprises a shielding case of aluminum formed by die casting and having side walls and a base, a plurality of partition walls integrally formed with the shielding case, a printed circuit board securely mounted on the partition walls, and a high frequency oscillator securely mounted on the printed circuit board. The high frequency oscillator is encompassed with and shielded by the side walls and the base of the shielding case, the partition walls, and the printed circuit board.

According to the present invention, a space exerting influence on the frequency and phase of the oscillator is defined by a case body and a printed circuit board, thereby providing a high stability high frequency oscillator having stable space conditions against microphonic vibrations.

BRIEF DESCRIPTION OF THE DRAWINGS

This and other objects and features of the present invention will become more apparent from the following description taken in conjunction with the preferred embodiment thereof with reference to the accompanying drawings, throughout which like parts are designated by like reference numerals, and wherein.

DETAILED DESCRIPTION OF THE PREFERRED EMBODIMENTS

Figure 1:
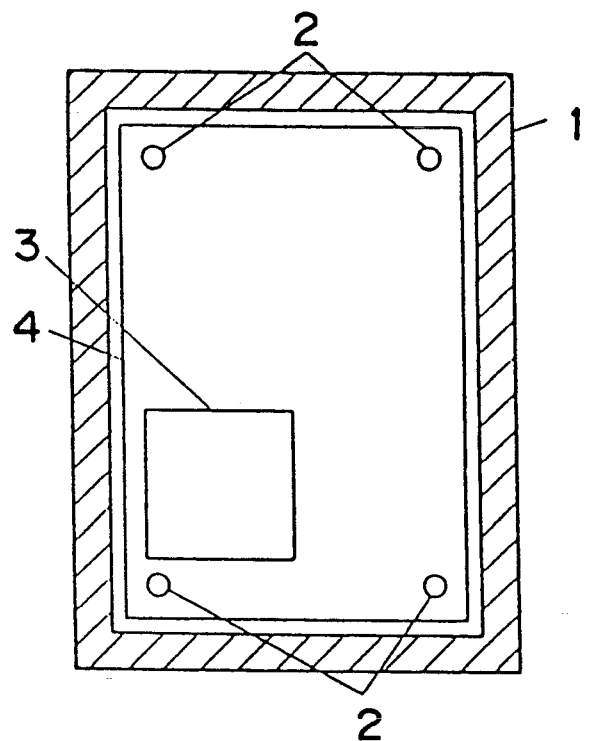
FIG. 1 is a top plan view of a conventional arrangement for stabilization of the frequency and phase of a high frequency oscillator.
Figure 2:
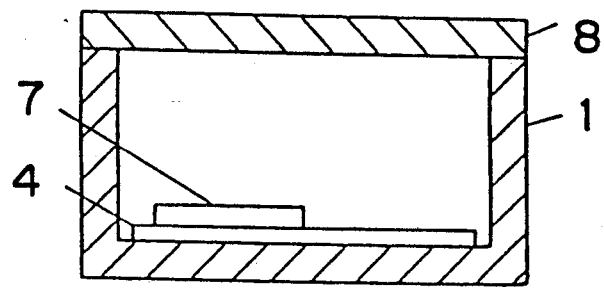
FIG. 2 is a side elevational view of the arrangement of FIG. 1.
Figure 3:
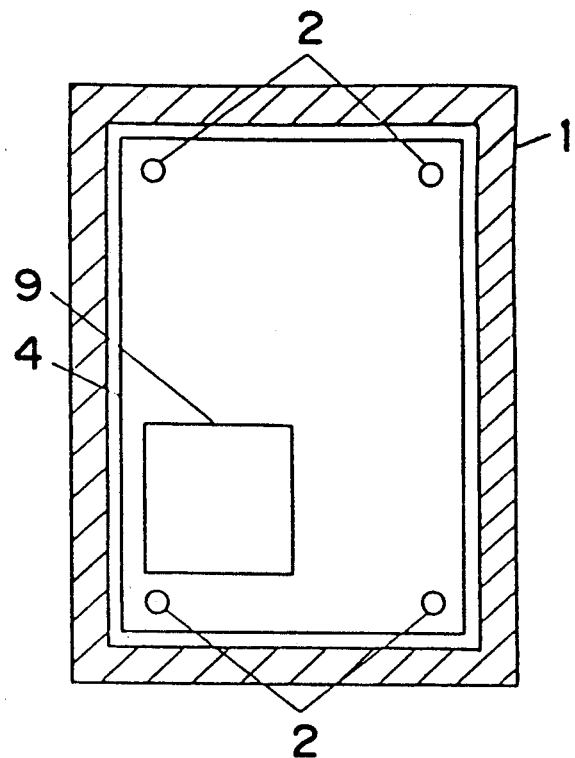
FIG. 3 is a top plan view of another conventional arrangement.
Figure 4:
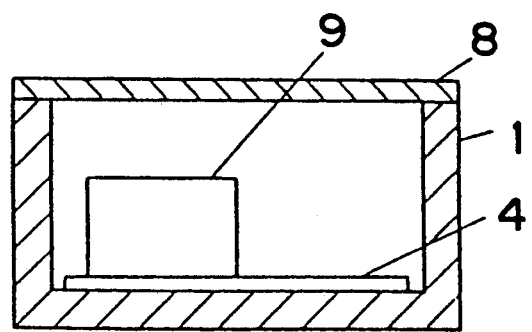
FIG. 4 is a side elevational view of the arrangement of FIG. 3.
Figure 5:
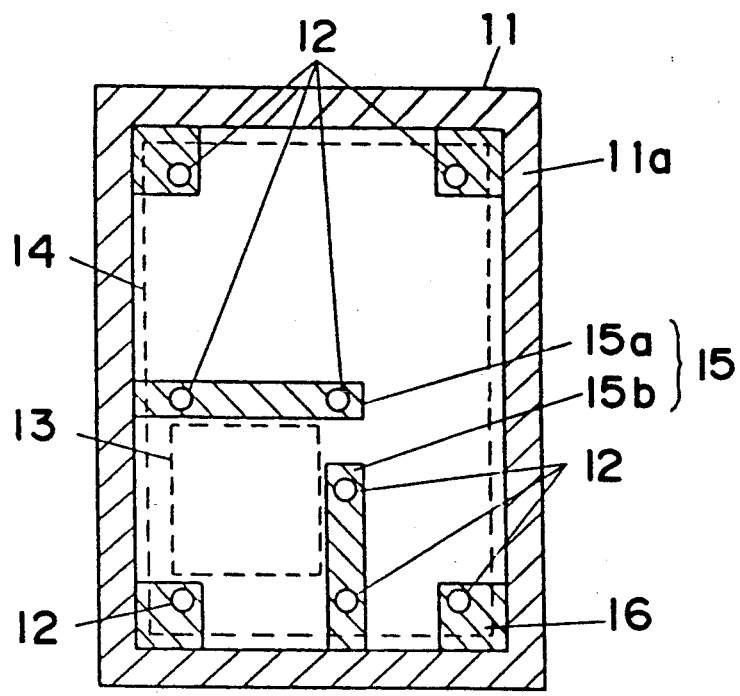
FIG. 5 is a top plan view of an arrangement for stabilization of the frequency and phase of a high frequency oscillator according to the present invention.
Figure 6:
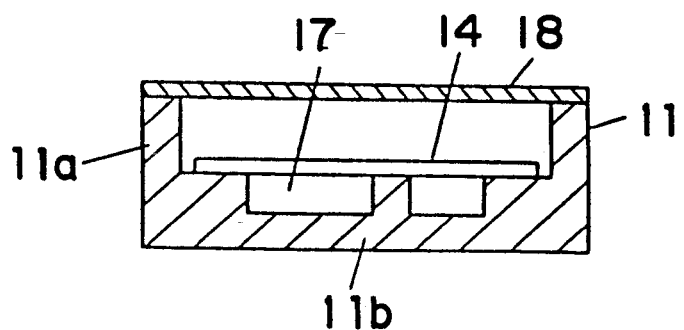
FIG. 6 is a side elevational view of the arrangement of FIG. 5.

A novel arrangement for a high frequency oscillator according to the present invention is illustrated in FIGS. 5 and 6 and comprises a shielding case 11 of aluminum formed by die casting and having side walls 11a and a base 11b, a plurality of, for example two, partition walls 15 integrally formed with the shielding case 11, a plurality of mounts 16 integrally formed with the shielding case 11 at respective internal corners thereof, and an oscillator 13 disposed in a space 17 defined by the side walls 11a and the base 11b of the shielding case 11 and the partition walls 15. The partition walls 15 include a partition wall 15a and a partition wall 15b spaced from and generally perpendicular to each other.

The oscillator 13 is securely mounted on a printed circuit board 14, which is securely mounted on the partition walls 15 and the mounts 16 by means of a plurality of screws 12. That side of the printed circuit board 14 on which the oscillator 13 is mounted is opposed to he base 11b of the shielding case 11. A cover 18 is secured to the shielding case 11.

Preferably, the oscillator 13 comprises a resonator.

The arrangement described above can make space conditions extremely stable against microphonic vibrations, and therefore, the oscillation frequency and phase are extremely stable against the microphonic vibrations. Furthermore, this arrangement can be made compact at a very low cost.

If there is no spurious mode vibrations, the cover 18 is not necessarily required because a shielding space is encompassed with and shielded by the printed circuit board 14 and the shielding case 11.

As is clear from the above, according to the present invention, the space which may cause distortion in oscillation frequency and phase is defined by the shielding case 11 and the printed circuit board 14. As a result, space conditions are made stable, thereby providing a high frequency oscillator with an extremely stable characteristic against microphonic vibrations. Accordingly, the arrangement according to the present invention is practically very effective.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. An arrangement for stabilizing the oscillation frequency and phase of a high frequency oscillator, which comprises:
   a shielding case of aluminum formed by die casting and having side walls and a base;
   a plurality of partition walls integrally formed with said shielding case;
   a printed circuit board mounted on said partition walls; and
   a high frequency oscillator mounted on said printed circuit board, said high frequency oscillator being encompassed with and shielded by said side walls and base of said shielding case, said partition walls, and said printed circuit board.

2. The arrangement according to claim 1, wherein said partition walls comprise two partition walls generally perpendicular to each other.

3. The arrangement according to claim 1 further comprising a plurality of mounts integrally formed with said shielding case at respective internal corners thereof for support of said printed circuit board.

4. The arrangement according to claim 1, wherein said high frequency oscillator comprises a resonator.

* * * * *